(12) United States Patent
Kim et al.

(10) Patent No.: US 7,112,507 B2
(45) Date of Patent: Sep. 26, 2006

(54) MIM CAPACITOR STRUCTURE AND METHOD OF FABRICATION

(75) Inventors: Sun-Oo Kim, Hopewell Junction, NY (US); Ernst Demm, Putnam Valley, NY (US)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 10/720,450

(22) Filed: Nov. 24, 2003

(65) Prior Publication Data

US 2005/0112836 A1     May 26, 2005

(51) Int. Cl.
*H01L 21/20* (2006.01)

(52) U.S. Cl. .............. 438/396; 257/E21.008; 257/E21.021

(58) Field of Classification Search ........... 438/396; 257/E21.008, E21.016, E21.019, E21.021
See application file for complete search history.

(56) References Cited

U.S. PATENT DOCUMENTS

| | | | |
|---|---|---|---|
| 5,741,722 A | 4/1998 | Lee | |
| 5,909,044 A | 6/1999 | Chakravarti et al. | |
| 5,918,135 A | 6/1999 | Lee et al. | |
| 5,986,301 A | 11/1999 | Fukushima et al. | |
| 6,020,238 A | 2/2000 | He et al. | |
| 6,033,953 A | 3/2000 | Aoki et al. | |
| 6,080,657 A | 6/2000 | Liu et al. | |
| 6,087,726 A | 7/2000 | Hsia et al. | |
| 6,174,798 B1 | 1/2001 | Hsia et al. | |
| 6,180,976 B1 | 1/2001 | Roy | |
| 6,198,122 B1 | 3/2001 | Habu et al. | |
| 6,235,594 B1 | 5/2001 | Merchant et al. | |
| 6,310,373 B1 | 10/2001 | Azuma et al. | |
| 6,313,003 B1 | 11/2001 | Chen | |
| 6,329,234 B1 | 12/2001 | Ma et al. | |
| 6,337,238 B1 | 1/2002 | Nakabayashi | |
| 6,379,577 B1 | 4/2002 | Akatsu et al. | |
| 6,384,442 B1 | 5/2002 | Chen | |
| 6,451,664 B1 | 9/2002 | Barth et al. | |
| 6,709,918 B1* | 3/2004 | Ng et al. | 438/253 |
| 2002/0020836 A1 | 2/2002 | Kikuchi et al. | |
| 2002/0102809 A1* | 8/2002 | Barth et al. | 438/393 |
| 2003/0006480 A1 | 1/2003 | Lian et al. | |
| 2003/0109100 A1 | 6/2003 | Takata et al. | |
| 2004/0232467 A1* | 11/2004 | Otsuki et al. | 257/303 |
| 2004/0256654 A1 | 12/2004 | Korner et al. | |
| 2005/0012223 A1 | 1/2005 | Koller et al. | |

FOREIGN PATENT DOCUMENTS

| | | |
|---|---|---|
| EP | 1 221 715 A2 | 7/2002 |
| WO | WO 03/054933 A1 | 7/2003 |
| WO | WO 03/054934 A1 | 7/2003 |

\* cited by examiner

*Primary Examiner*—Caridad Everhart
(74) *Attorney, Agent, or Firm*—Slater & Matsil LLP

(57) ABSTRACT

A method of forming a metal-insulator-metal (MIM) capacitor wherein a plate of a MIM capacitor is formed in the entire thickness of a metallization layer of a semiconductor device. At least one thin conductive material layer is disposed within the material of the metallization layer to reduce the surface roughness of the metallization layer, thus improving the reliability of the MIM capacitor. The thin conductive material layer may comprise TiN, TaN, or WN and may alternatively comprise a barrier layer disposed over or under the TiN, TaN, or WN. One plate of the MIM capacitor is patterned using the same mask that is used to pattern conductive lines in a metallization layer, thus reducing the number of masks that are required to manufacture the MIM capacitor.

31 Claims, 5 Drawing Sheets

MIM CAPACITOR STRUCTURE AND METHOD OF FABRICATION

TECHNICAL FIELD

The present invention relates generally to the fabrication of semiconductor devices, and more particularly to the fabrication of metal-insulator-metal (MIM) capacitor structures.

BACKGROUND

Capacitors are elements that are used extensively in semiconductor devices for storing an electrical charge. Capacitors essentially comprise two conductive plates separated by an insulator. The capacitance, or amount of charge held by the capacitor per applied voltage, depends on a number of parameters such as the area of the plates, the distance between the plates, and the dielectric constant value of the insulator between the plates, as examples. Capacitors are used in filters, analog-to-digital converters, memory devices, control applications, and many other types of semiconductor devices.

One type of capacitor is a MIM capacitor, which is frequently used in mixed signal devices and logic semiconductor devices, as examples. MIM capacitors are used to store a charge in a variety of semiconductor devices. MIM capacitors are often used as storage nodes in a memory device, for example. A MIM capacitor is typically formed horizontally on a semiconductor wafer, with two metal plates sandwiching a dielectric layer parallel to the wafer surface.

A prior art MIM capacitor 114 formed in a semiconductor device is shown in FIG. 1. The semiconductor device includes a workpiece 100, which may comprise a semiconductor wafer or substrate having active areas, components or other material layers formed thereon. A plurality of metallization layers are typically formed over the workpiece 100. For example, a top metallization layer $M_n$ may comprise a plurality of conductive lines 122, and an underlying metallization layer $M_{(n-1)}$ may be disposed beneath the top metallization layer $M_n$. The metallization layer $M_{(n-1)}$ may also comprise a plurality of conductive lines 106 formed therein. An inter-level dielectric (ILD) layer is disposed between the conductive lines 106 and 122, not shown. There may be other metallization layers beneath the metallization layer $M_{(n-1)}$, also not shown, e.g., there may be two to four additional metallization layers disposed beneath metallization layer $M_{(n-1)}$. The metallization layers $M_n$, $M_{(n-1)}$, and other metallization layers not shown provide an interconnect system, along with vias 104 formed in insulating layer 102 and vias 118 formed in insulating layer 120, for example. The conductive lines 106 and 122 and vias 104 and 118 provide an interconnect means between various components and active regions formed in the workpiece 100 and also provide connection to contacts that will be used to make electrical contact outside the semiconductor device (not shown).

The metallization layers $M_n$ and $M_{(n-1)}$ typically comprise copper or aluminum. Copper has a lower resistance and a higher conductivity than aluminum, but requires damascene processes and more expensive manufacturing processes. Aluminum is typically patterned using a subtractive etch process, for example.

FIG. 1 illustrates a prior art MIM capacitor 114 formed in the via dielectric layer 120. To form the MIM capacitor 114, after conductive lines 106 are formed in metallization layer $M_{(n-1)}$, a conductive material 108 is deposited over the conductive lines 106 and ILD layer disposed between the conductive lines 106 (not shown). The conductive material 108 typically comprises TiN, for example. The conductive material 108 is patterned with a pattern for a MIM capacitor bottom plate using lithography; e.g., a photoresist may be deposited, the photoresist is patterned, and the photoresist is used as a mask while the conductive material 108 is etched to remove portions of the conductive material 108 and form a bottom plate 108. A capacitor dielectric layer 110 is then deposited over the bottom plate 108, and a conductive material 112 is deposited over the capacitor dielectric material 110. The conductive material 112 and dielectric material 110 are patterned with a pattern for the MIM capacitor 114 top plate, as shown, using traditional lithography techniques, for example. An insulating material 120 is deposited over the MIM capacitor 114, and the insulating material 120 is patterned with vias 116 and filled with conductive material, wherein the vias 116 provide electrical contact between the top plate 112 of the MIM capacitor 114 and an overlying conductive line 122 in metallization layer M1.

The prior art method of forming a MIM capacitor 114 shown in FIG. 1 is disadvantageous in that two mask levels are required to pattern the MIM capacitor 114: one mask for the bottom plate 108, and another mask for the top plate 112 and dielectric material 110 patterning. Each metallization layer $M_n$ and $M_{(n-1)}$ and via layers 102 and 116/118 also require a separate mask to pattern conductive lines 122 and 106, and vias 102 and 116/118, respectively.

What is needed in the art is a method of patterning a MIM capacitor and a structure thereof wherein fewer mask levels are required during the fabrication process for forming a MIM capacitor.

Another problem with the prior art MIM capacitor 114 of FIG. 1 is that TiN is used as a bottom electrode 108 material. TiN has a relatively high sheet resistance, which results in an increased resistance for the MIM capacitor 114. Using TiN for a plate of a MIM capacitor limits the use of MIM capacitor devices in high speed and high performance applications, such as radio frequency (RF) applications.

What is also needed is a MIM capacitor with plates having reduced sheet resistance.

SUMMARY OF THE INVENTION

Embodiments of the present invention achieve technical advantages by providing a method of forming a MIM capacitor having reduced mask levels, or requiring a fewer number of masks to fabricate a MIM capacitor. In one embodiment, one plate of a MIM capacitor is formed in the entire thickness of a metallization layer. In this embodiment, the mask level for the metallization layer includes a pattern for conductive lines in an interconnect region and also includes a pattern for at least one MIM capacitor bottom plate in a MIM capacitor region. The MIM capacitor plate formed in the metallization layer may comprise aluminum in one embodiment. A thin conductive material layer may be formed within one or more plates of the capacitor, the thin conductive material layer comprising a different material than the conductive material used for the metallization layer or capacitor plates. The thin conductive material layer reduces the surface roughness of the top surface of the metallization layer, thus providing a MIM capacitor having improved reliability.

In accordance with an embodiment of the present invention, a MIM capacitor plate includes a first conductive layer comprising a first material, and at least one thin conductive material layer disposed over the first conductive layer. The at least one thin conductive material layer includes a second material, the second material being different than the first material. At least one second conductive layer is disposed over at least one of the at least one thin conductive material layers.

In accordance with another embodiment of the present invention, a MIM capacitor includes a first plate, a dielectric material disposed over the first plate, and a second plate disposed over the dielectric material. The first plate or the second plate includes a first conductive layer, the first conductive layer comprising a first material, and at least one thin conductive material layer disposed over the first conductive layer. The thin conductive material layer includes a second material, the second material being different than the first material. The first plate or the second plate also includes at least one second conductive layer disposed over the at least one thin conductive material layer.

In accordance with yet another embodiment of the present invention, a semiconductor device includes a workpiece, at least one metallization layer formed over the workpiece, and at least one MIM capacitor formed over the workpiece. The MIM capacitor includes a first plate formed within the at least one metallization layer, a dielectric material disposed over the first plate, and a second plate disposed over the dielectric material. At least one first conductive line is formed in the at least one metallization layer of the semiconductor device, wherein the at least one first conductive line comprises a first thickness, and wherein the MIM capacitor first plate comprises the first thickness.

In accordance with another embodiment of the present invention, a method of manufacturing a MIM capacitor includes depositing a first conductive layer, the first conductive layer comprising a first material, and depositing at least one thin conductive material layer over the first conductive layer. The at least one thin conductive material layer includes a second material, the second material being different than the first material. The method includes depositing at least one second conductive layer over at least one of the at least one thin conductive material layers, and patterning the at least one second conductive layer, the at least one thin conductive material layer, and the first conductive layer to form a first plate.

Advantages of embodiments of the present invention include reducing the number of masks required to manufacture a MIM capacitor, resulting in reduced processing costs. The at least one thin conductive material layer creates a smooth, defect-free planar top surface of a metallization layer. When a bottom plate is formed in the metallization layer having an improved surface, a MIM capacitor with improved reliability results.

The manufacturing methods described herein are compatible with aluminum back-end-of-the-line (BEOL) processes. Via interconnects to subsequently-formed metallization layers have improved reliability. The at least one thin conductive material layer may advantageously function as an etch stop during subsequent via interconnect formation. The method provides an increased process window for reactive ion etch processes that may be used to pattern the various material layers of the semiconductor device. The manufacturing method and MIM capacitors described herein are compatible with high-performance and high-speed applications such as RF semiconductor applications, as an example.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2A:
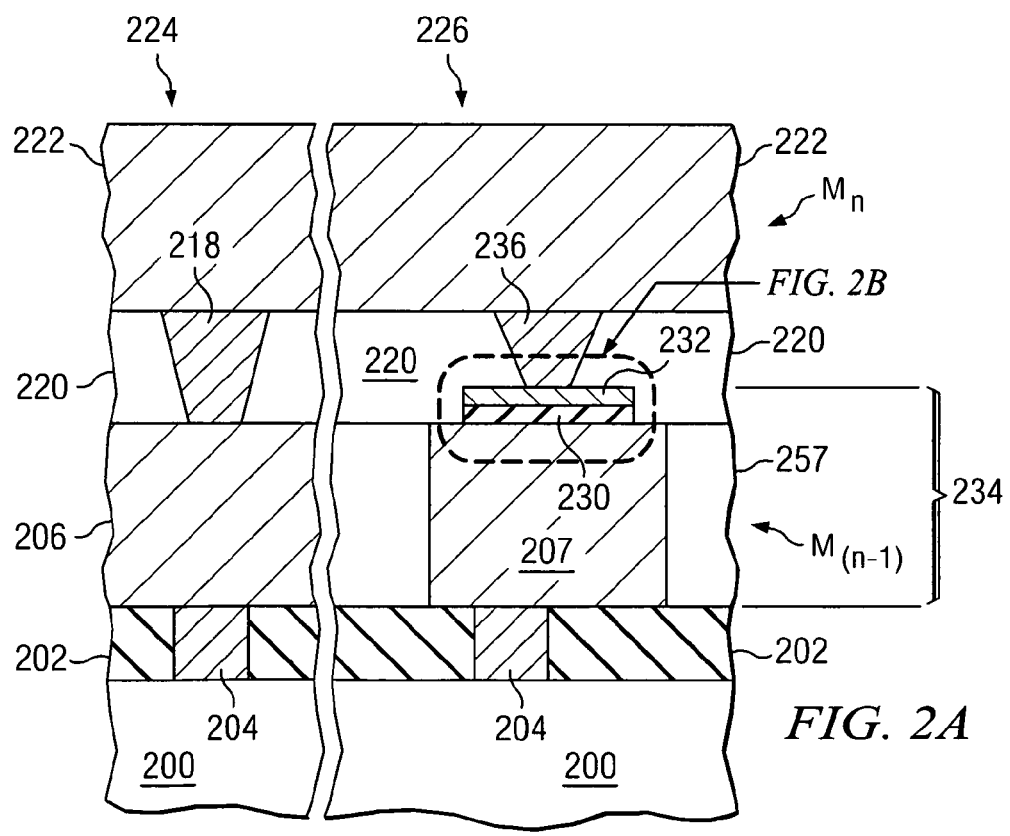
FIG. 2A shows a cross-sectional view of a preferred embodiment of the present invention, wherein a MIM capacitor is formed having a bottom plate that resides within an entire thickness of a metallization layer of a semiconductor device.

FIG. 2A shows a cross-sectional view of a preferred embodiment of the present invention, wherein a MIM capacitor is formed having a bottom plate that resides within an entire thickness of a metallization layer of a semiconductor device. First, a workpiece 200 is provided. The workpiece 200 preferably comprises a semiconductor substrate and may include active areas or device regions formed therein, not shown. The workpiece may include a semiconductor substrate comprising silicon or other semiconductor materials covered by an insulating layer, for example. The workpiece may also include other active components or circuits formed in the front end of line (FEOL), not shown. The workpiece may comprise silicon oxide over single-crystal silicon, for example. The workpiece may include other conductive layers or other semiconductor elements, e.g. transistors, diodes, etc. Compound semiconductors, GaAs, InP, Si/Ge, or SiC, as examples, may be used in place of silicon. One or more metallization layers may be formed over the workpiece 200, also not shown.

An insulating layer 202 is deposited over the workpiece 200. The insulating layer 202 may comprise an oxide such as silicon dioxide, silicated glass (fluorinated silicon glass (FSG)), or low dielectric constant materials, as examples. The insulating layer 202 may alternatively comprise other dielectric materials typically used as insulators in semiconductor devices. The insulating layer 202 may be patterned for optional via studs 204 in both an interconnect region 224 and a MIM capacitor region 226, as shown. The optional via studs 204 may provide electrical connection from elements or devices within the workpiece 200 or metallization layers disposed over the workpiece 200 to metallization layers 206 and 222 that will be formed.

A conductive material 206 is deposited over the insulating material 202. The conductive material 206 preferably comprises aluminum in accordance with a preferred embodiment of the present invention. For example, the conductive material 206 may comprise Al or alloys containing Al. Aluminum is less costly to process than other conductive materials, such as copper, for example. However, the conductive material 206 may also comprise other conductive materials, for example. The conductive material 206 is preferably subtractively etched to simultaneously form conductive lines 206 in an interconnect region 224 and to form a bottom plate 207 of a MIM capacitor 234 in a MIM capacitor region 226. An insulating layer 257 is deposited over the conductive lines 206 and the bottom plate 207, and any excess insulating material 257 is removed from the top surface of the conductive lines 206 and the bottom plate 207 by an etch process or polishing process such as a chemical-mechanical polish (CMP) process, as examples.

A dielectric material 230 is deposited over the patterned conductive lines 206 and bottom plate 207. The dielectric material 230 preferably comprises a material suitable for use as a capacitor dielectric, and may comprise a high-dielectric constant material, as an example. The dielectric material 230 is deposited over the entire surface of the workpiece, including the interconnect regions 224 and the MIM capacitor regions 226.

A conductive material 232 is deposited over the dielectric material 230. The conductive material 232 may comprise Al or alloys containing Al, or other conductive materials, as examples. The conductive material 232 and the dielectric material 230 are patterned using lithography techniques to form a top plate 232 and capacitor dielectric 230 of a MIM capacitor 234. Preferably, a single mask is used to pattern both the top plate 232 and the capacitor dielectric material 230.

An insulating layer 220 is deposited over the MIM capacitor 234 and conductive lines 206. The insulating layer 220 may comprise an insulator such as an oxide, silicated glass, or low dielectric constant materials, for example. The insulating layer 220 is patterned with a pattern for vias 218 in the interconnect region 224 and vias 236 in the MIM capacitor region 226. The vias 218 make electrical contact to conductive lines 206 in the interconnect region 224, and vias 236 make electrical contact to the top plate 232 of the MIM capacitor 234 in the MIM capacitor region 226, for example. A conductive material is deposited to fill the vias 218 and 236, and excess conductive material is removed from the top surface of the insulating layer 220 using an etch or CMP process, as examples.

A conductive material 222 is deposited over the vias 218 and 236 and insulating layer 220. The conductive material 206 preferably comprises Al, alloys containing Al, or other conductive materials, for example. The conductive material 222 is patterned in a subtractive etch process to form conductive lines 222 in both the interconnect region 224 and the MIM capacitor region 226. In accordance with the preferred embodiment of the present invention, the MIM capacitor 234 is formed in or in close proximity to an upper metallization layer $M_{(n-1)}$ of the semiconductor device. The conductive lines 222 that make electrical contact with the top plate of the MIM capacitor 234 by via 236 are preferably formed in a top metallization layer $M_n$ of the semiconductor device, in one embodiment. Although only one MIM capacitor 234 is shown in FIG. 2A, there may be a plurality of MIM capacitors 234 formed in a semiconductor device.

The structure and method of forming a MIM capacitor 234 shown in FIG. 2A is advantageous in that the bottom plate 207 of the MIM capacitor 234 is patterned using the same mask that is used to pattern the conductive lines 206. The bottom plate 207 formed in the metallization layer $M_{(n-1)}$ may comprise aluminum and therefore has a reduced sheet resistance in comparison to MIM capacitors having plates comprising other higher resistance materials. Advantageously, the MIM capacitor bottom plate 207 may be coupled to a conductive line formed in the same metallization layer $M_{(n-1)}$ (not shown) rather than using a via stud 204 to provide electrical connection to the bottom plate 207.

Figure 2B:
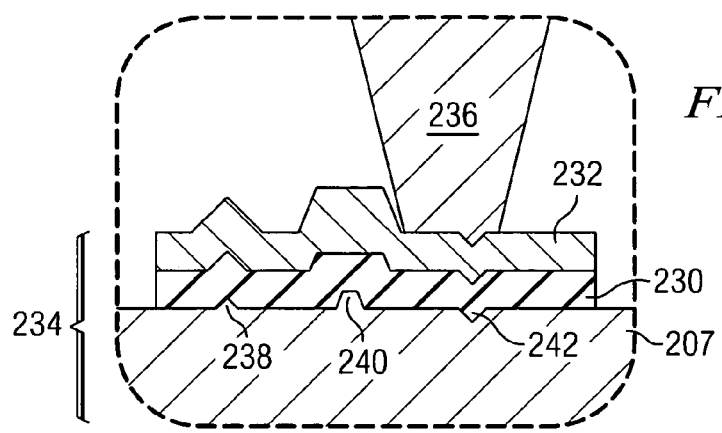
FIG. 2B shows a more detailed view of the MIM capacitor shown in FIG. 2A, wherein surface roughness and irregularities in the top surface of a metallization layer can cause reliability problems in the MIM capacitor.

However, this embodiment of the present invention is less preferred because the conductive material of the bottom plate 207 and conductive lines 206 has defects in the top surface. The bottom plate 207 and conductive lines 206 preferably comprise aluminum, which can exhibit surface morphology, as shown in FIG. 2B, which is a more detailed view of the MIM capacitor 234 shown in FIG. 2A. The aluminum bottom plate 207 comprises a rough top surface that may include granular formations 238, hillock formations 240, and may also include dimples 242 of grain boundaries. These topological features are replicated in the subsequently-deposited dielectric material 230 and top plate 232, as shown. The non-planar MIM capacitor 234 having irregular surface topography may cause early dielectric breakdown and may degrade the MIM capacitor 234 reliability.

Figure 3:
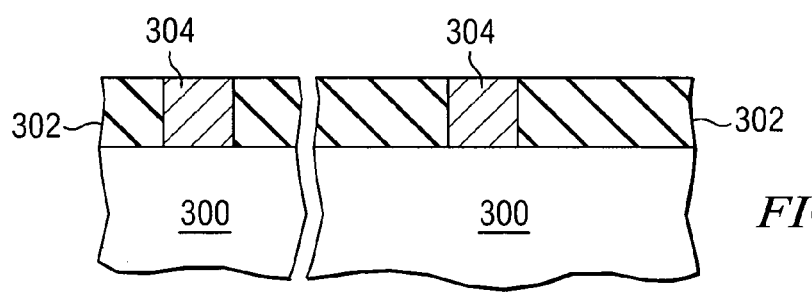
FIGS. 3, 4A through 4D, 5, and 6 show cross-sectional views of a preferred embodiment of the present invention, wherein a thin conductive material layer is formed within a metallization layer of a semiconductor device, and wherein conductive lines and a bottom plate of a MIM capacitor are formed in the multi-layer metallization layer.

In a preferred embodiment of the present invention, a novel multi-layer structure is used for the conductive material of the metallization layer that is used as the bottom plate of a MIM capacitor, as shown in FIGS. 3, 4A through 4D, 5, and 6, which smoothes the top surface of the MIM capacitor bottom plate and removes defects. First, a workpiece 300 is provided, comprising similar materials as described for workpiece 200 in FIG. 2A. An optional insulating layer 302 is formed over the workpiece 300, and via plugs 304 may be formed in the insulating layer 302 by patterning the insulating layer 302, depositing a conductive material 304, and removing any excess conductive material from the top surface of the insulating layer 302, as shown in FIG. 3.

Figure 4A:
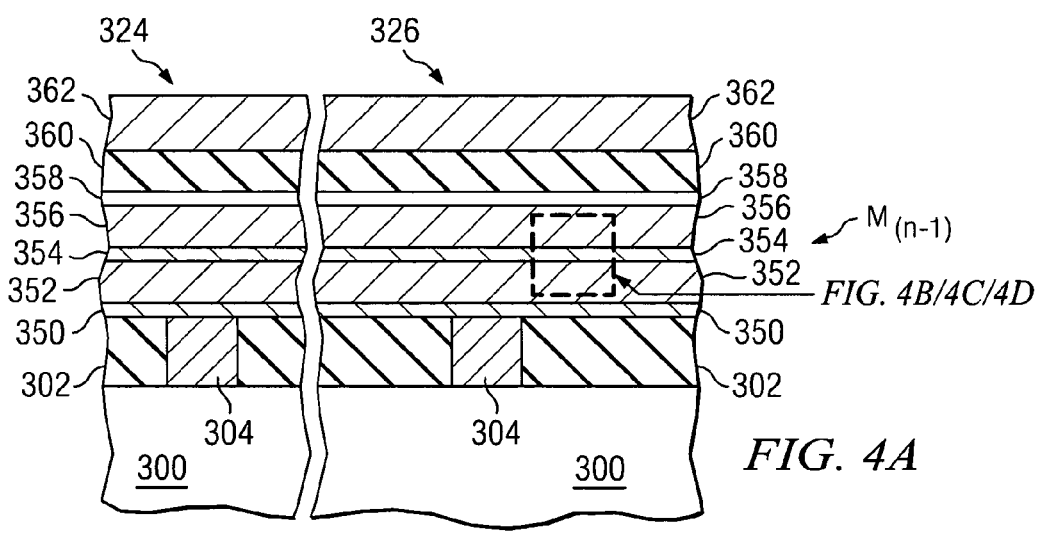

An optional barrier layer 350 may be formed over the insulating layer 302 and via plugs 304, as shown in FIG. 4A. The barrier layer 350 preferably comprises Ti, and alternatively may comprise a bi-layer of Ti/TiN or may comprise other materials, as examples.

A first conductive layer 352 is deposited over the optional barrier layer 350. The first conductive layer 352 preferably comprises aluminum in a preferred embodiment, although aluminum alloys or other conductive materials may also be used. The first conductive layer 352 preferably comprises a thickness of about 2500 to 3000 Å. In one embodiment, the first conductive layer 352 comprises about one half of the thickness of the metallization layer that includes first conductive layer 352, thin layer 354, and second conductive layer 356, which will be described further herein.

In accordance with a preferred embodiment of the present invention, a thin conductive material layer 354 is deposited or formed over the first conductive layer 352. The thin conductive material layer 354 preferably comprises a thin layer of a conductive material such as TiN, TaN, or WN, as examples, although alternatively, other conductive materials may be used.

Figure 4B:
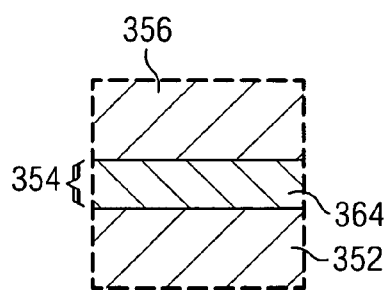

In one embodiment, the thin conductive material layer 354 comprises a single layer of thin conductive material 364, as shown in a detailed view in FIG. 4B. The thin conductive material 364 preferably comprises a thickness of about 50 to 100 Å, for example, and alternatively may comprise a thickness of about 450 Å or less. The thin conductive material 364 may be deposited using a physical vapor deposition (PVD) such as a sputtering process, although alternatively, chemical vapor deposition (CVD) may be used to deposit the thin conductive material 364. The thin conductive material 364 preferably comprises a thin layer of a conductive material such as TiN, TaN, or WN, as examples, although alternatively, other conductive materials may be used.

Figure 4C:
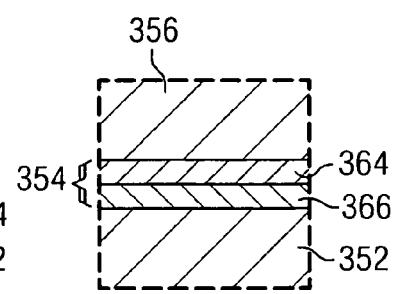

In another embodiment, shown in FIG. 4C, the thin conductive material layer 354 comprises a first barrier layer 366 deposited over the bottom plate 352. The first barrier layer 366 is optional and may comprise Ti, Ta, or W deposited in a thickness of about 150 Å or less, for example. In this embodiment, the thin conductive material 364 comprising about 50 to 100 Å of TiN, TaN, or WN, as examples, is deposited over the first barrier layer 366. The first barrier layer 366 improves the adhesion between the aluminum bottom plate 352 and the thin conductive material 364. The first barrier layer 366 also enhances the quality of the thin conductive material 364.

Figure 4D:
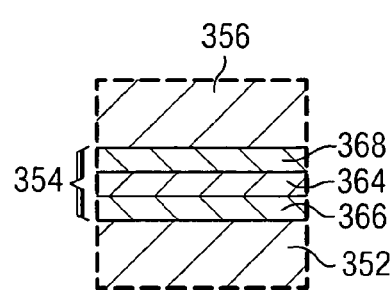

In yet another embodiment, the thin conductive material layer 354 further comprises an optional second barrier layer 368 disposed over the thin conductive material 364, as shown in FIG. 4D. The second barrier layer 368 may comprise about 30 to 100 Å of Ti, Ta, or W deposited over the thin conductive material 364. The second barrier layer 368 improves the adhesion of the thin conductive material 364 to the subsequently-formed second conductive layer 356. In this embodiment, the first barrier layer 366 is optional.

Referring again to FIG. 4A, a second conductive layer 356 is deposited over the thin conductive material layer 354. The second conductive layer 356 preferably comprises the same material as the first conductive layer 352, and preferably comprises aluminum in one embodiment. Alternatively, the second conductive layer 356 may comprise other conductive materials, for example. Note that the second conductive layer 356 and the first conductive layer 352 preferably comprise conductive materials that may be patterned using a subtractive etch process. In one embodiment, the first conductive layer 352 and second conductive layer 356 preferably do not comprise copper, which typically is deposited using damascene techniques, for example. The second conductive layer 356 preferably comprises a thickness of about 2500 to 3000 Å, and may alternatively comprise a thickness of about 500 Å to 2500 Å. The second conductive layer 356 preferably in one embodiment comprises a thickness of about 3000 Å. The second conductive layer 356 preferably comprises about ½ of the desired thickness of the metallization layer $M_{(n-1)}$, for example. The total thickness of the metallization layer $M_{(n-1)}$ may comprise about 5000 Å, for example.

By disposing a thin conductive material layer 354 between the first conductive layer 352 and second conductive layer 366, the surface topography of the second conductive layer 366 is improved. Therefore, the top surface of the second conductive layer 366 is absent the grains, hillocks and dimples that are found in prior art metallization layers (see FIG. 2B), thereby improving the metallization layer $M_{(n-1)}$ for use as a bottom plate of a MIM capacitor.

Next, an optional antireflective coating (ARC) may be deposited over the second conductive layer 356. The optional ARC layer 358 may comprise Ti or TiN, and may alternatively comprise a bilayer of TiN with a top layer of Ti disposed over the TiN, for example. The ARC layer 358 may comprise a thickness of about 100 to 300 Å, for example. The ARC layer 358 may alternatively comprise other materials. The optional ARC layer 358 decreases critical dimension (CD) variations and improves the lithography process by reducing off-normal reflection and standing wave effects. The ARC layer 358 preferably comprises a thickness of less than about 450 Å, for example.

Next, a dielectric layer 360 is deposited over the optional ARC layer 358, or the second conductive layer 356, if an ARC 358 is not used. The dielectric layer 360 preferably comprises a material suitable for use as a capacitor dielectric, such as high dielectric constant materials or other insulators, as examples. A conductive material 362 is deposited over the dielectric layer 360, as shown in FIG. 4A. The conductive material 362 preferably comprises aluminum, aluminum alloys, or other conductive materials that may be subtractively etched, for example. The conductive material 362 will form the top plate of a MIM capacitor, to be described further herein.

Note that while MIM capacitors will be formed in the MIM capacitor region 326 and not in the interconnect region 324 of the semiconductor device, the optional barrier layer 350, first conductive layer 352, thin conductive material layer 354, second conductive layer 356, optional ARC layer 358, dielectric layer 360, and conductive material 362 are deposited over the entire surface of the workpiece 300. The optional barrier layer 350, first conductive layer 352, thin conductive material layer 354, and second conductive layer 356 comprise a metallization layer $M_{(n-1)}$ of the semiconductor device. In one embodiment, the metallization layer $M_{(n-1)}$ comprises the metallization layer beneath the top metallization layer $M_n$ (not shown in FIG. 4A, see FIG. 6)

of the semiconductor device. Alternatively, the metallization layer $M_{(n-1)}$ may comprise a first, second, or third metallization layer formed over the workpiece 300, in one embodiment, as examples.

Figure 5:
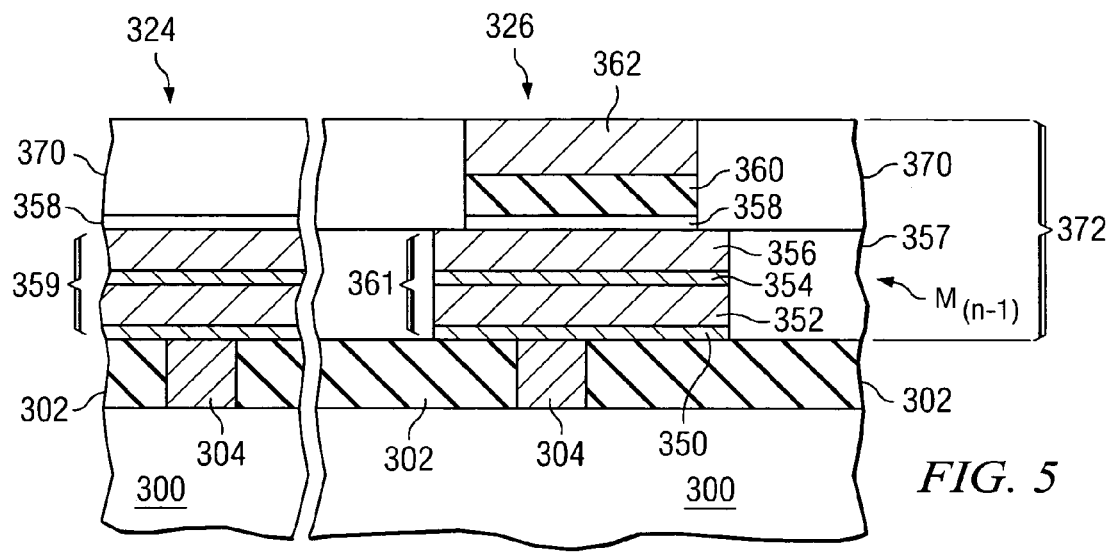

In this embodiment, the metallization layer $M_{(n-1)}$ is patterned with the pattern for the bottom plate 361 of the MIM capacitor 372, as shown in FIG. 5, simultaneously while conductive lines 359 are formed in the interconnect region 324 of the semiconductor device. The conductive material 362 and dielectric layer 360 (and optional ARC layer 358) are patterned with a pattern for a top plate of the MIM capacitor 372, as shown.

The bottom plate 361 formed within the metallization layer $M_{(n-1)}$ and the interconnect lines 359 in the interconnect region 324 may be patterned before depositing the dielectric layer 360 and conductive material 362, not shown. An insulating layer 357 is then deposited between the patterned bottom plate 361 and conductive lines 359. Capacitor dielectric layer 360 is deposited over the bottom plate 361, conductive lines 350, and insulating layer 357, and the conductive material 362 is deposited over the dielectric layer 360. The conductive material 362 and dielectric layer 360 are then patterned using a single mask to form the top plate and capacitor dielectric of the MIM capacitor 372.

Alternatively, the dielectric layer 360 may be deposited over the unpatterned metallization layer $M_{(n-1)}$, and a conductive material 362 may be deposited over the dielectric layer 360. Either the bottom plate 361 and conductive lines 359 within the metallization layer $M_{(n-1)}$ may be patterned first, or the top plate 362 and dielectric layer 360 may be patterned first, in accordance with embodiments of the present invention.

Advantageously, the bottom plate 361 of the MIM capacitor 372 in the MIM capacitor region 326 is patterned using the same lithography mask that is used to pattern the conductive lines 359 in the interconnect region 324. This results in reduced costs because a separate mask level is not required to manufacture the bottom plate 361 of the MIM capacitor 372.

The etch chemistry used to etch the materials of the metallization layer $M_{(n-1)}$ may comprise $BCl_3$ and $Cl_2$, for example. The ratio of these chemistries may be adjusted for each different material layer 352, 354, and 356, for example. Other etch chemistries and processes may alternatively be used to pattern the metallization layer $M_{(n-1)}$.

Figure 6:
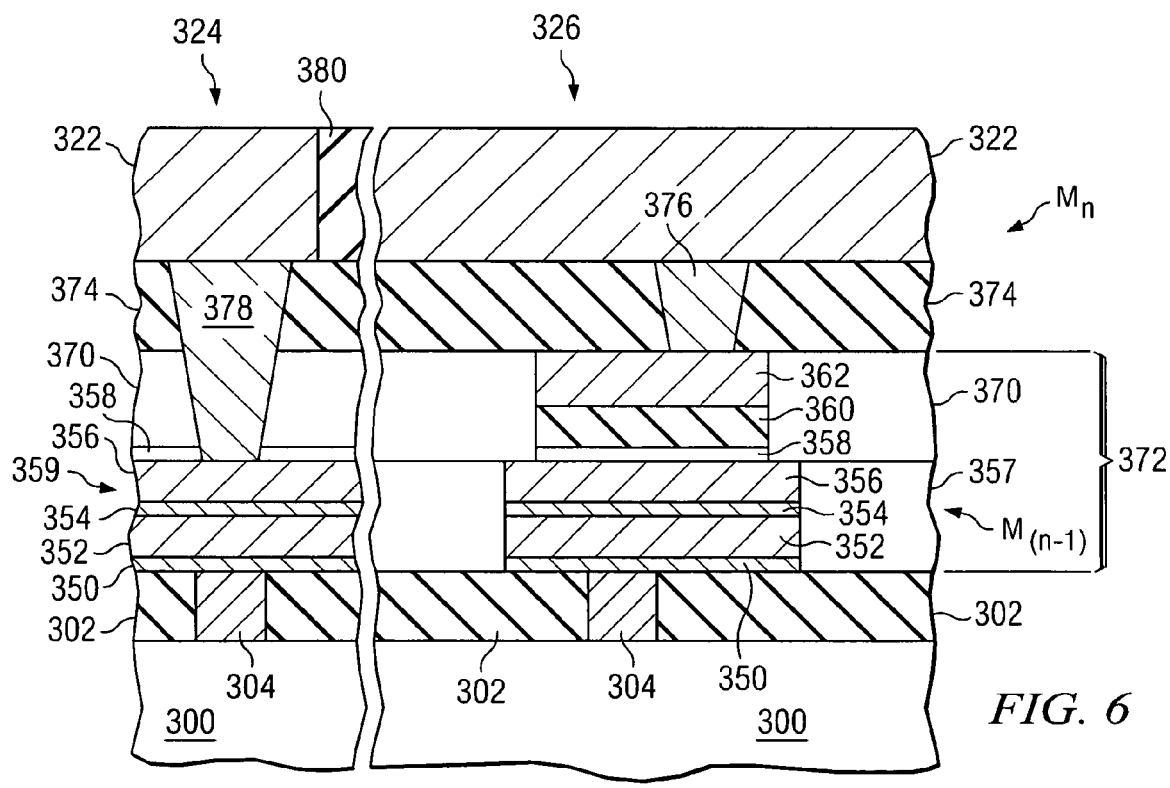

Subsequent processing of the semiconductor device is then performed on the workpiece 300, as shown in FIG. 6. An insulating layer 370 comprising an oxide or other insulators, as examples, may be deposited over the top plate 362 and the conductive lines 359, as shown in FIG. 6. An insulating layer 374 may be deposited over the top plate 362 and insulating material 370, and the insulating material 374 may be patterned to form vias 378 within insulating layers 374 and 370 to make contact with conductive lines 359 in the interconnect region 324, and also to form vias 376 within insulating layer 374 that make electrical contact to the top plate 362 of the MIM capacitor 372 in the MIM capacitor region 326. The vias 378 and 376 may be filled with a conductive material, and a top metallization layer $M_n$ preferably comprising aluminum, aluminum alloys or other conductive materials is deposited over insulating layer 374 and vias 378 and 376. The metallization layer $M_n$ is patterned to form conductive lines 322 in both the interconnect region 324 and the MIM capacitor region 326.

Insulating layer 374 and insulating layer 370 may comprise a single insulating layer in one embodiment. For example, after forming the capacitor 372 top plate 362, a single insulating layer 370/374 is deposited over the top plate 362 and is planarized. Then the single insulating layer 370/374 is patterned for vias 376 and 378.

Inserting a buried thin conductive material layer 354 between conductive layers 352 and 356 allows the thickness of the conductive layers 352 and 356 to be reduced and optimized, which reduces surface roughness that can be caused by the boundaries of large aluminum grains. A decreased grain size is achieved with reduced layer thickness of aluminum, for example. The thin conductive material layer 354 preferably is deposited at temperatures below temperatures that cause hillock formation in aluminum, for example.

Figure 7:
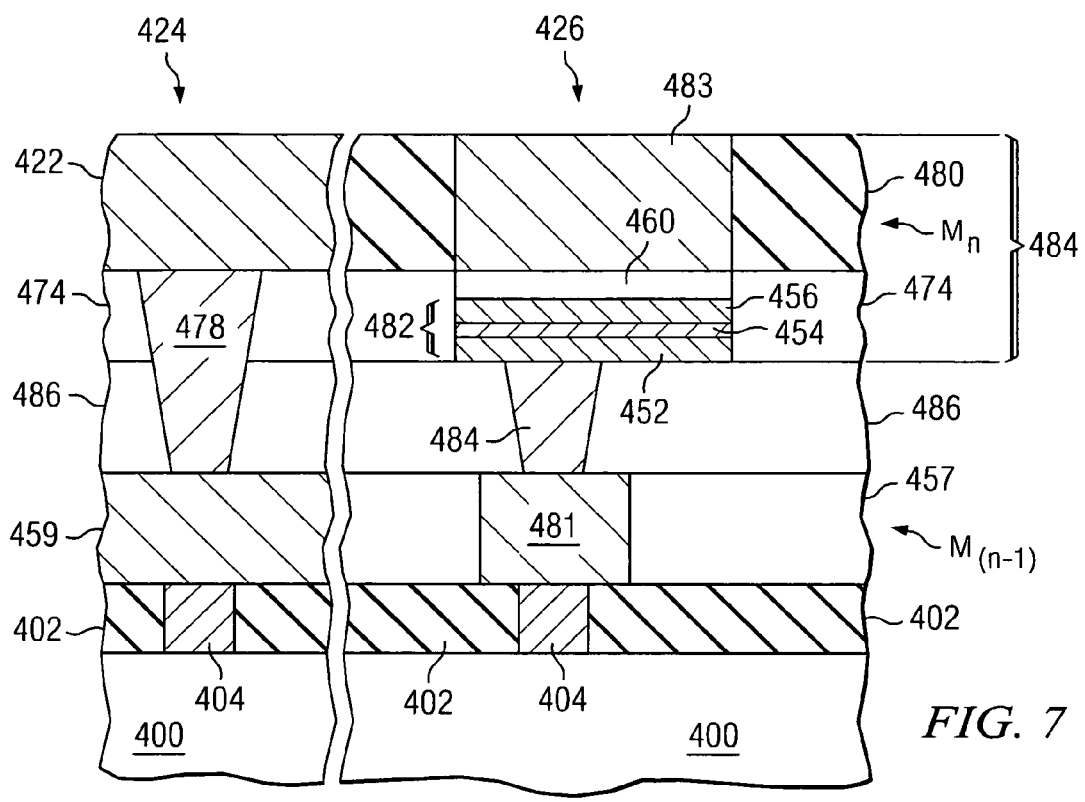
FIG. 7 illustrates an embodiment of the present invention in which a thin conductive material layer is disposed within a bottom plate of a MIM capacitor, wherein the MIM capacitor bottom plate is not formed in a metallization layer.
Figure 8:
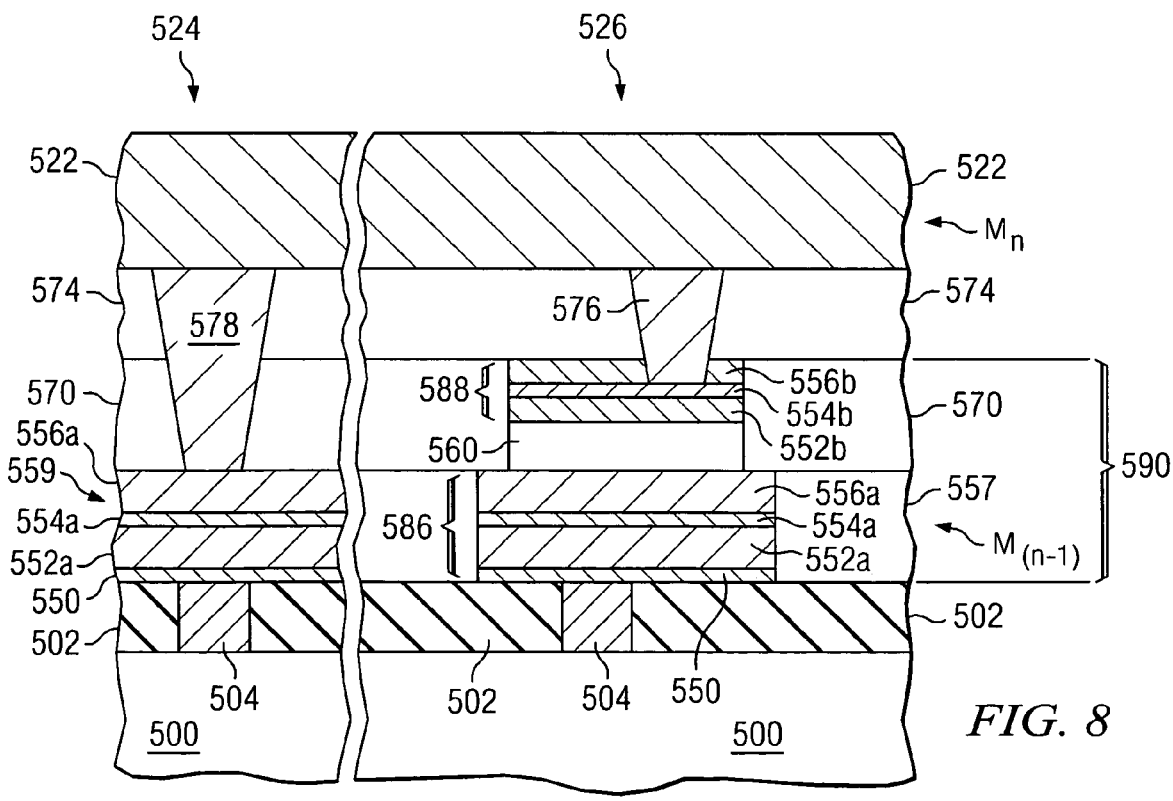
FIG. 8 shows an embodiment of the present invention in which both the bottom plate and the top plate have a thin conductive material layer disposed therein.
Figure 9:
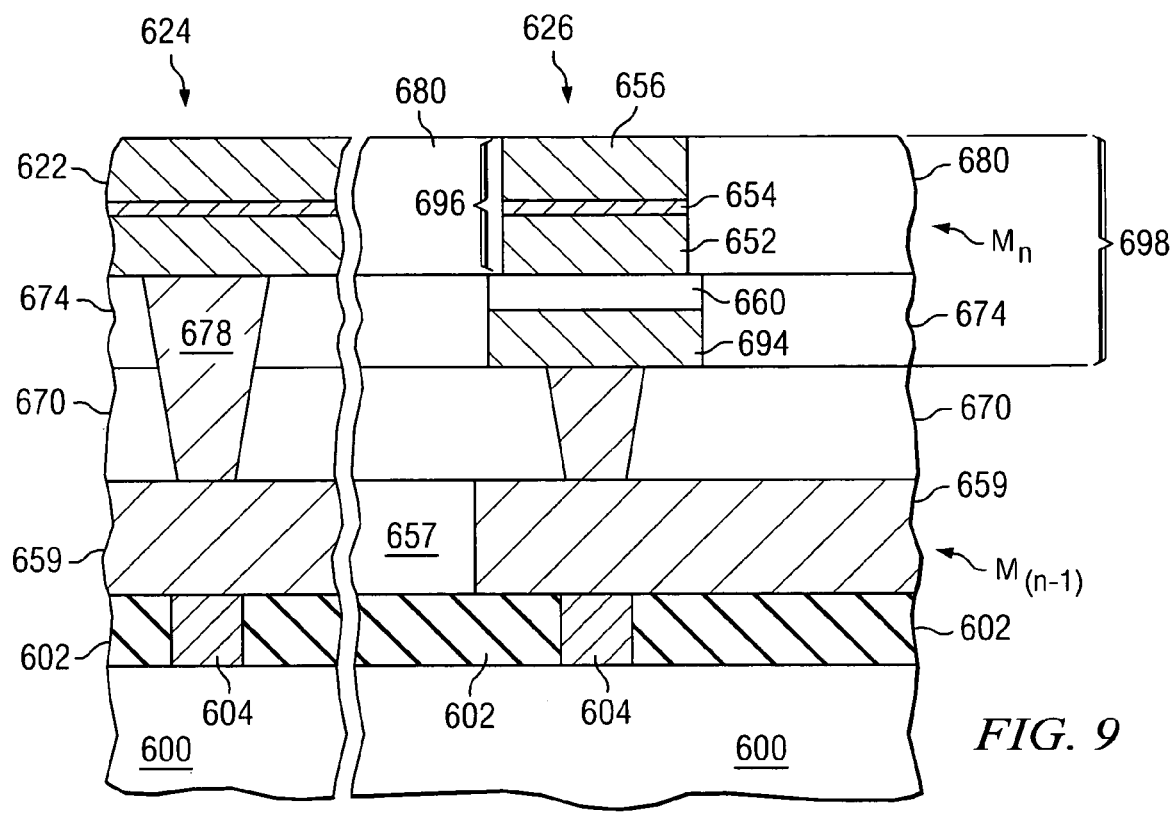
FIG. 9 illustrates an embodiment of the present invention in which the top plate is formed in a metallization layer of a semiconductor device and includes a thin conductive material layer disposed therein.

FIGS. 7, 8, and 9 illustrate three possible embodiments of the present invention, in which a thin conductive material layer is disposed within either the top plate, the bottom plate, or both, in accordance with embodiments of the present invention. Either the top plate or the bottom plate of a MIM capacitor may optionally be formed in a metallization layer simultaneously while conductive lines are formed within the metallization layer, in accordance with embodiments of the present invention.

FIG. 7 illustrates an embodiment of the present invention in which a thin conductive material layer 454 is disposed within a bottom plate 482 of a MIM capacitor 484, and wherein the bottom plate 482 is not formed in a metallization layer. In this embodiment, a conductive material 481 is formed within insulating layer 457 that is disposed over via plug 404 formed in insulating layer 402 disposed over the workpiece 400. A via 484 is disposed within the subsequently-formed insulating layer 486, wherein the conductive material 481 provides electrical contact between underlying via plug 404 and via 484. A first conductive layer 452 is deposited over insulating layer 486 and via 484, and a thin conductive material layer 454 is deposited over the first conductive layer 452. A second conductive layer 456 is deposited over the thin conductive material layer 454. The first conductive layer 452, thin conductive material layer 454 and second conductive material layer 456 preferably comprise materials and thicknesses as described with reference to first conductive layer 352, thin conductive material layer 354 and second conductive material layer 356, respectively, of FIG. 4A, for example.

The second conductive layer 456, the thin conductive material layer 454, and the first conductive layer 452 are patterned to form a bottom plate 482, as shown. A capacitor dielectric 460 may be deposited over the second conductive layer 456 and patterned simultaneously with the patterning of the bottom plate 482, for example. An insulating layer 474 is deposited over the patterned dielectric layer 460 and conductive layers 456, 454, and 452. Vias 478 are formed in the interconnect region 424 of the semiconductor device, and a conductive material 422 is deposited over insulating layer 474. The conductive material 422 is patterned to form a top plate 483 in the MIM capacitor region 426 and a plurality of conductive lines 422 in the interconnect region 424. In this embodiment, advantageously, the top plate 483 of the MIM capacitor 484 resides in a top metallization layer $M_n$, and the top plate 483 in the MIM capacitor region 426 is patterned simultaneously with the patterning of the plurality of conductive lines 422 in the interconnect region 424, thereby not requiring a separate mask for patterning the top plate 483 of the MIM capacitor 484.

FIG. 8 shows an embodiment of the present invention in which both the bottom plate 586 and the top plate 588 have a thin conductive material layer 554a and 554b, respectively, disposed therein. In this embodiment, preferably a thin conductive material layer 554a is disposed between a first conductive layer 552a and second conductive layer 556a in a first metallization layer $M_{(n-1)}$ as described with reference to FIGS. 5 and 6. To avoid redundancy, not all reference numerals and elements are described with reference to FIG. 8 herein: like numerals are used for the various elements shown in FIGS. 5 and 6. Advantageously, the top plate 588 in this embodiment also comprises a thin conductive material layer 554b disposed between a first conductive layer 552b and a second conductive layer 556b. The MIM capacitor 590 thus comprises a bottom plate 586 having a thin conductive material layer 554a disposed therein and a top plate 588 comprising a thin conductive material layer 554b disposed therein. The thin conductive material layers 554a and 554b improve or smooth the texture or topography of the top surface of the second conductive layer 556a and 556b, respectively. A via 576 is formed within insulating layer 574 to make electrical contact to the top plate 588 of the MIM capacitor 590, and conductive lines 522 are then formed in the top metallization layer $M_n$. Note that in this embodiment, advantageously, the thin conductive material layer 554b may function as an etch stop for the via 576 patterning. Thus, the via 576 is landed on the top surface of the thin conductive material layer 554b, as shown.

FIG. 9 illustrates an embodiment of the present invention in which the top plate 696 of a MIM capacitor 698 is formed in a metallization layer $M_n$ of a semiconductor device and includes a thin conductive material layer 654 disposed therein. Again, all reference numbers are not described or discussed herein to avoid redundancy; see the description with reference to FIGS. 5 and 6 in which like numerals are used for the various material layers of the semiconductor device. In this embodiment, the top plate 696 of a MIM capacitor 698 includes a first conductive layer 652, a thin conductive material layer 654 deposited thereon, and a second conductive layer 656 deposited over the thin conductive material layer 654. The bottom plate 694 may comprise a single conductive layer comprising aluminum or aluminum alloys, for example, although the bottom plate 694 may alternatively comprise other conductive materials, for example. The bottom plate 694 may also comprise a first conductive layer, a thin conductive material layer, and a second conductive layer as described with reference to FIG. 8, not shown. In this embodiment, advantageously, the top plate 696 of the MIM capacitor 698 formed in the MIM capacitor region 626 is patterned simultaneously with the patterning of the plurality of conductive lines 622 that are formed within the interconnect region 624 in metallization layer $M_n$. This is advantageous because a separate mask for the patterning of the top plate 696 of the MIM capacitor 698 is not required. Note that in this embodiment, the plurality of conductive lines 622 in the interconnect region 624 also comprise a thin conductive material layer 654 disposed therein. An optional barrier layer (not shown) may be deposited over insulating layer 674 before the first conductive layer 652 is deposited, to improve adhesion between the insulating layer 674 and the first conductive layer 652.

Figure 10:
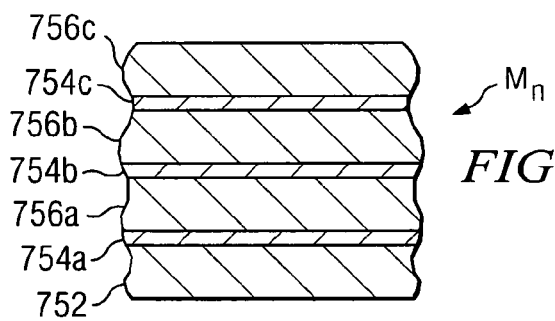
FIG. 10 shows a cross-sectional view of a MIM capacitor plate in accordance with an embodiment of the present invention, wherein a plurality of thin conductive material layers are formed within the plate.

Preferably in accordance with embodiments of the present invention, at least one thin conductive material layer is disposed within a conductive material of at least one plate of a MIM capacitor. In particular, the MIM capacitor plates may comprise two or more thin conductive material layers disposed therein. FIG. 10 shows a cross-sectional view of a plate of a MIM capacitor in accordance with an embodiment of the present invention, wherein the MIM capacitor plate comprises three thin conductive material layers 754a, 754b and 754c disposed between conductive layers 752 and 756a, 756a and 756b, and 756b and 756c, respectively. Preferably, at least one conductive layer 756a, 756b, 756c is deposited over at least one of the at least one thin conductive material layers 754a, 754b and 754c, as shown. The MIM capacitor plate may be formed in a metallization layer $M_n$ of a semiconductor device, as previously described herein.

Figure 11:
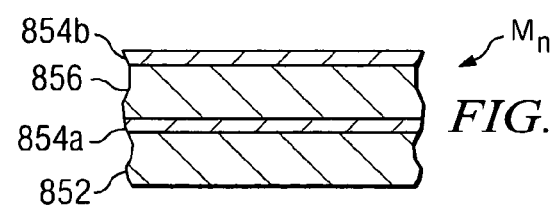
FIG. 11 illustrates another embodiment of the present invention, wherein a thin conductive material layer is formed over a top surface of the capacitor plate.

FIG. 11 shows an embodiment of the present invention, wherein a MIM capacitor plate comprises a plurality of thin conductive material layers 854a and 854b, without a conductive material layer disposed over the top thin conductive material layer 854b. A thin conductive material layer 854a is formed between a conductive layer 852 and second conductive layer 856. A thin conductive material layer 854b is deposited or formed over the top second conductive layer 856. Preferably, in accordance with embodiments of the present invention, at least one second conductive layer 856 is deposited over at least one of the thin conductive material layers 854a, as shown. Again, the MIM capacitor plate may be formed in a metallization layer $M_n$ of a semiconductor device, as previously described herein.

The thickness of the metallization layer or metal plates is preferably adjusted to achieve the desired resistance of the MIM capacitor plate. For example, the material (e.g., TiN, TaN, WN, Ti, Ta, or W) of thin the conductive material layers may have a higher resistance than the materials (Al, Al alloys) used for the conductive layers. Therefore, the total thickness of the plate may be increased to achieve the desired resistance.

The insulating layers described herein preferably comprise typical insulators used in semiconductor manufacturing, such as silicon dioxide, low dielectric constant materials or other materials, for example. The metallization layers preferably comprise aluminum.

Figure 1:
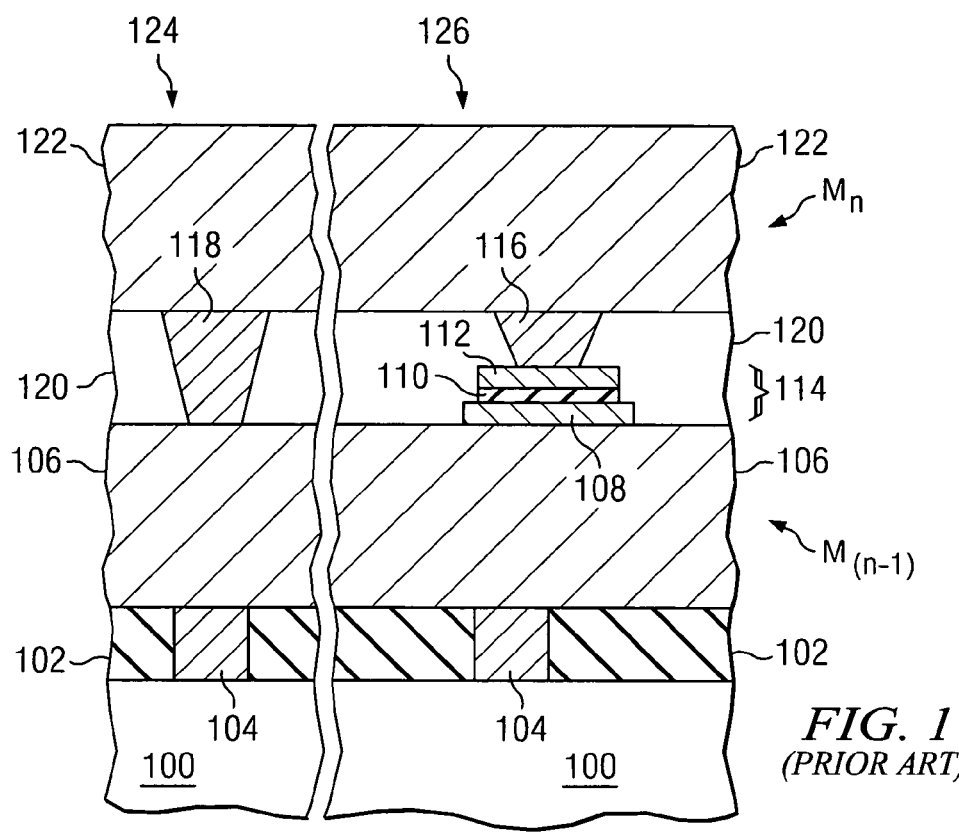
FIG. 1 shows a cross-sectional view of a semiconductor device comprising a prior art MIM capacitor structure.

Advantages of embodiments of the invention include reducing the number of masks required to manufacture a MIM capacitor, resulting in reduced processing costs. The at least one thin conductive material layer creates a smooth, defect-free planar top surface of a metallization layer. When a bottom plate is formed in the metallization layer having an improved surface, a MIM capacitor with improved reliability results. The manufacturing methods described herein are compatible with aluminum back-end-of-the-line (BEOL) processes because the conductive materials preferably comprise aluminum or aluminum alloys. Via interconnects to subsequently-formed metallization layers have improved reliability, and the method provides an increased process window for reactive ion etches used to pattern the various material layers. The manufacturing methods and MIM capacitor structures described herein are compatible with high-performance and high-speed applications such as RF semiconductor applications, as an example. The bottom plate of the MIM capacitor preferably comprises a substantial percentage of aluminum, which has a lower resistance than TiN, which is used in prior art MIM capacitor bottom plates (such as TiN bottom plate 108 shown in FIG. 1). Thus, the reduced resistance MIM capacitors described herein have the advantages of increased speed, reduced power consumption, and improved performance. Furthermore, a MIM capacitor plate formed in accordance with embodiments of the present invention in a metallization layer may advantageously be coupled to a conductive line formed in the same metallization layer, rather than using a via stud in a previously or subsequently deposited layer to make electrical contact to the plate.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A metal-insulator-metal (MIM) capacitor plate, comprising:
   a first conductive layer having a first surface and a thickness of between about 2500 Å to 3000 Å the first conductive layer comprising a first material;
   at least one thin conductive material layer having a first surface and a second surface, and a thickness of between about 50 Å and 450 Å disposed over the first conductive layer, such that said second surface of said at least one thin conductive layer is in direct contact, including electrical contact, with the first surface of said first conductive layer, the thin conductive material layer comprising a second material, the second material being different than the first material; and
   at least one second conductive layer having a second surface and a thickness of between about 500 Å and 3000 Å disposed over at least one of the at least one thin conductive material layers, such that said second surface of said at least one second conductive layer is in direct contact, including electrical contact, with the first surface of said at least one thin conductive layer, wherein each of the first conductive layer, the at least one thin conductive layer and the at least one second conductive layer are electrically coupled together to form said MIM capacitor plate and are each patterned to have outer edges that are aligned relative to one another.

2. The MIM capacitor plate according to claim 1, wherein the at least one thin conductive material layer comprises TiN, TaN, or WN.

3. A metal-insulator-metal (MIM) capacitor plate, comprising:
   a first conductive layer, the first conductive layer comprising a first material and having a first surface and a thickness of between about 2500 Å and 3000 Å;
   at least one thin conductive material having a first surface and a second surface and a thickness of between about 500 Å and 450 Å layer disposed over the first conductive layer, such that said second surface is in direct contact, including electrical contact, with the first surface of said first conductive layer, the thin conductive material layer comprising a second material, the second material being different than the first material, wherein the at least one thin conductive material layer comprises a first barrier layer disposed over the first conductive layer; and a conductive layer disposed over the first barrier layer; and
   at least one second conductive layer having a second surface and a thickness of about 500 Å and 3000 Å disposed over at least one of the at least one thin conductive material layers, such that said second surface of said at least one second conductive layer is in direct contact, including electrical contact, with the first surface of said at least one thin conductive layer.

4. The MIM capacitor plate according to claim 3, wherein the first barrier layer comprises Ti, Ta or W, and wherein the conductive layer comprises TiN, TaN, or WN.

5. The MIM capacitor plate according to claim 3, wherein the at least one thin conductive material layer further comprises a second barrier layer disposed over the conductive layer.

6. The MIM capacitor plate according to claim 5, wherein the first barrier layer comprises Ti, Ta or W, wherein the conductive layer comprises TiN, TaN, or WN, and wherein the second barrier layer comprises Ti, Ta or W.

7. A metal-insulator-metal (MIM) capacitor plate, comprising:
   a first conductive layer, the first conductive layer comprising a first material and having a first surface and a thickness of about 2500 Å to 3000 Å;
   at least one thin conductive material layer having a first surface and a second surface and a thickness of between about 50 Å and 450 Å disposed over the first conductive layer, such that said second surface is in direct physical contact, including electrical contact, with the first surface of said first conductive layer, the thin conductive material layer comprising a second material, the second material being different than the first material; and
   at least one second conductive layer having a second surface and a thickness of between about 500 Å and 3000 Å disposed over at least one of the at least one thin conductive material layers, such that said second surface of said at least one second conductive layer is in direct physical contact including electrical contact with the first surface of said at least one thin conductive materials, and wherein the at least one second conductive layer comprises the first material and such that said first conductive layer, said at least one thin conductive layer and said at least one second conductive layer comprises said MIM capacitor plate.

8. The MIM capacitor plate according to claim 1, wherein the first conductive layer and the at least one second conductive layer comprise Al.

9. The MIM capacitor plate according to claim 1, wherein the MIM capacitor plate is formed in a metallization layer of a semiconductor device, the metallization layer comprising a plurality of conductive lines having a first thickness, wherein the MIM capacitor plate comprises the first thickness.

10. The MIM capacitor plate according to claim 1, wherein the MIM capacitor plate comprises a bottom plate of a MIM capacitor.

11. The MIM capacitor plate according to claim 1, wherein the MIM capacitor plate comprises a top plate of a MIM capacitor.

12. The MIM capacitor plate according to claim 7, wherein the first material comprises aluminum.

13. The MIM capacitor plate according to claim 12, wherein the second material is selected from the group consisting of TiN, TaN and WN.

14. A metal-insulator-metal (MIM) capacitor, comprising:
a first plate;
a dielectric material disposed over the first plate; and
a second plate disposed over the dielectric material, wherein one of the first plate and the second plate comprises:
a first conductive layer, the first conductive layer having a first surface and a thickness of between about 2500 Å and 3000 Å, and comprising a first material;
at least one thin conductive material layer having a first and a second surface and a thickness of between about 50 Å and 450 Å disposed over the first conductive layer, such that said second surface of said at least one thin conductive layer is in direct physical contact, including electrical contact with the first surface of said first conductive layer, the at least one thin conductive material layer comprising a second material, the second material being different than the first material; and
at least one second conductive layer having a second surface and a thickness of about 500 Å and 3000 Å disposed over at least one of the at least one thin conductive material layers, such that said second surface of said at least one second conductive layer is in direct physical contact, including electrical contact, with the first surface of said at least one thin conductive layer, wherein each of the first conductive layer, the at least one thin conductive layer and the at least one second conductive layer are electrically coupled together to form said MIM capacitor plate and are each patterned to include outer edges that are aligned relative to one another.

15. The MIM capacitor according to claim 14, wherein either the first plate or second plate is formed in a metallization layer of a semiconductor device, the metallization layer comprising a plurality of conductive lines having a first thickness, wherein the MIM capacitor first plate or second plate comprises the first thickness.

16. The MIM capacitor according to claim 14, wherein the at least one thin conductive material layer comprises TiN, TaN, or WN.

17. The MIM capacitor according to claim 14, wherein the first conductive layer and the at least one second conductive layer comprise the same material.

18. The MIM capacitor according to claim 14, wherein the first conductive layer and the at least one second conductive layer comprise Al.

19. The MIM capacitor according to claim 14, wherein the at least one thin conductive material layer comprises:
a first barrier layer disposed over the first conductive layer; and
a conductive layer disposed over the first barrier layer.

20. The MIN capacitor according to claim 19, wherein the first barrier layer comprises Ti, Ta or W, and wherein the conductive layer comprises TiN, TaN, or WN.

21. The MIM capacitor according to claim 19, wherein the at least one thin conductive material layer further comprises a second barrier layer disposed over the conductive layer.

22. The MIN capacitor according to claim 21, wherein the first barrier layer comprises Ti, Ta or W, wherein the conductive layer comprises TN, TaN, or WN, and wherein the second barrier layer comprises Ti, Ta or W.

23. The MIM capacitor according to claim 14, wherein the other one of the first plate and second plate comprises:
a third conductive layer disposed over the dielectric material, the third conductive layer comprising a third material;
at least one second thin conductive material layer disposed over the third conductive layer, the at least one second thin conductive material layer comprising a fourth material, the fourth material being different than the third material; and
at least one fourth conductive layer disposed over at least one of the at least one second thin conductive material layers.

24. The MIM capacitor according to claim 23, wherein the first conductive layer, the at least one second conductive layer, the third conductive layer and the at least one fourth conductive layer comprise Al, and wherein the at least one first thin conductive material layer and the at least one second thin conductive material layer is comprised of TiN, TaN, or WN.

25. The MIM capacitor according to claim 24, wherein the at least one first thin conductive material layer and the at least one second thin conductive material layer further comprise a barrier layer disposed over or under the TiN, TaN or WN.

26. A metal-insulator-metal (MIM) capacitor comprising:
a first conductive plate comprising a first layer of aluminum having a top surface and a second layer of aluminum having a bottom surface separated by a layer of conductive material having a bottom surface and a top surface, said top surface of said first layer of aluminum in direct physical contact with the bottom surface of said layer of conductive material and said top surface of said layer of conductive material in direct physical contact with said bottom surface of said second layer of aluminum, the conductive material comprising TiN, TaN or WN;
a capacitor dielectric adjacent the first conductive plate; and
a second conductive plate adjacent the capacitor dielectric, wherein the first conductive plate, the capacitor dielectric and the second conductive plate form a capacitor.

27. The MIM capacitor of claim 26, wherein the first conductive plate overlies the capacitor dielectric and wherein the capacitor dielectric overlies the second conductive plate.

28. The MIM capacitor of claim 26, wherein the second conductive plate overlies the capacitor dielectric and wherein the capacitor dielectric overlies the first conductive plate.

29. The MIM capacitor of claim 26, wherein the first conductive plate is formed within a metallization layer, the metallization layer further including a plurality of conductive lines, wherein the first conductive plate and the plurality of conductive lines each have a common thickness.

30. The MIM capacitor of claim 26, wherein the layer of conductive material has a thickness of less than about 450Å.

31. The MIM capacitor of claim 26, wherein the second conductive plate comprises a first layer of aluminum and a second layer of aluminum separated by a layer of conductive material, the conductive material comprising TiN, TaN or WN.

* * * * *